United States Patent
Cui et al.

(10) Patent No.: US 8,058,183 B2
(45) Date of Patent: Nov. 15, 2011

(54) RESTORING LOW DIELECTRIC CONSTANT FILM PROPERTIES

(75) Inventors: Zhenjiang Cui, San Jose, CA (US); May Yu, Fremont, CA (US); Alexandros T. Demos, Fremont, CA (US); Mehul Naik, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 172 days.

(21) Appl. No.: 12/481,382

(22) Filed: Jun. 9, 2009

(65) Prior Publication Data
US 2009/0317971 A1    Dec. 24, 2009

Related U.S. Application Data

(60) Provisional application No. 61/074,984, filed on Jun. 23, 2008.

(51) Int. Cl.
*H01L 21/31*    (2006.01)
*H01L 21/469*   (2006.01)
*H01L 21/20*    (2006.01)
*H01L 21/36*    (2006.01)

(52) U.S. Cl. ........ 438/778; 438/787; 438/758; 438/781; 438/478

(58) Field of Classification Search .......... 438/618, 438/781, 778, 787, 758, 759, 760, 756, 478, 438/479
See application file for complete search history.

(56) References Cited

U.S. PATENT DOCUMENTS
6,703,324 B2 *  3/2004  Wong ............................ 438/787
7,094,681 B2 *  8/2006  Fujita et al. ................. 438/619

\* cited by examiner

*Primary Examiner* — Chuong A. Luu
(74) *Attorney, Agent, or Firm* — Blakely, Sokoloff, Taylor & Zafman LLP

(57) ABSTRACT

A method for restoring the dielectric constant of a low dielectric constant film is described. A porous dielectric layer having a plurality of pores is formed on a substrate. The plurality of pores is then filled with an additive to provide a plugged porous dielectric layer. Finally, the additive is removed from the plurality of pores.

13 Claims, 6 Drawing Sheets

RESTORING LOW DIELECTRIC CONSTANT FILM PROPERTIES

CROSS-REFERENCE TO RELATED APPLICATIONS

This application claims the benefit of U.S. Provisional Application No. 61/074,984, filed Jun. 23, 2008, the entire contents of which are hereby incorporated by reference herein.

BACKGROUND OF THE INVENTION

1) Field of the Invention

The invention is in the field of Semiconductor Processing.

2) Description of Related Art

For the past several decades, the scaling of features in integrated circuits has been the driving force behind an ever-growing semiconductor industry. Scaling to smaller and smaller features enables increased densities of functional units on the limited real estate of semiconductor chips. For example, shrinking transistor size allows for the incorporation of an increased number of logic and memory devices on a microprocessor, lending to the fabrication of products with increased complexity.

Scaling has not been without consequence, however. As the dimensions of the fundamental building blocks of microelectronic circuitry are reduced and as the sheer number of fundamental building blocks fabricated in a given region is increased, the constraints on the interconnecting wiring between the fundamental building blocks have become overwhelming. For example, metal interconnects are utilized in the fabrication of integrated circuits as a means of connecting various electronic and semiconductor devices into a global circuitry. Two key factors considered when fabricating such metal interconnects are the resistance (R) of each metal interconnect and the coupling capacitance (C), i.e. cross-talk, generated between metal interconnects. Both of these factors hamper the efficiency of metal interconnects. Thus, it has been desirable to reduce both the resistance in and the capacitance between metal interconnects in order to mitigate the so called "RC-delay."

For the past decade, the performance of integrated circuits, such as those found on microprocessors, has been greatly enhanced by the incorporation of copper interconnects into the "back-end" of line processing scheme. The presence of such copper interconnects, versus aluminum interconnects, greatly reduces the resistance of such interconnects lending to their improved conduction and efficiency.

Attempts to reduce the coupling capacitance generated between metal interconnects have included the use of low-K (K<3.9) dielectric layers that house the metal interconnects, where K is the dielectric constant of the dielectric layers. However, the incorporation of such films has proven to be challenging. For example, processing steps that occur following the deposition of such a low-K dielectric layer may undesirably increase its dielectric constant, lending to increased cross-talk between metal lines.

Thus, a method for restoring low dielectric constant film properties is described herein.

DETAILED DESCRIPTION

A method for restoring low dielectric constant film properties is described. In the following description, numerous specific details are set forth, such as fabrication conditions and material regimes, in order to provide a thorough understanding of the present invention. It will be apparent to one skilled in the art that the present invention may be practiced without these specific details. In other instances, well-known features, such as integrated circuit design layouts or photoresist development processes, are not described in detail in order to not unnecessarily obscure the present invention. Furthermore, it is to be understood that the various embodiments shown in the Figures are illustrative representations and are not necessarily drawn to scale.

Disclosed herein is a method for restoring the dielectric constant of a low dielectric constant film. A porous dielectric layer having a plurality of pores may be formed on a substrate. In accordance with an embodiment of the present invention, the plurality of pores is then filled with an additive to provide a plugged porous dielectric layer. Finally, the additive may be removed from the plurality of pores. In a specific embodiment, a chemical-mechanical polish technique is used to fill the plurality of pores with the additive.

Low dielectric constant (<3.9) dielectric films are often susceptible to undesirable film property modification during various process operations. For example, in accordance with an embodiment of the present invention, the pores of a porous low dielectric constant dielectric layer become plugged when exposed to additives included in a slurry used for chemical-mechanical polishing operations. When the pores become plugged by the additive, the dielectric constant of the porous dielectric layer may detrimentally increase. Thus, in accordance with an embodiment of the present invention, the dielectric constant of a porous dielectric layer is substantially restored by removing additives that plug the pores of the porous dielectric layer during a chemical-mechanical process operation. In one embodiment, the additive is removed by a technique such as, but not limited to, a thermal process, an ultra-violet radiation process or a plasma process.

Figure 1:
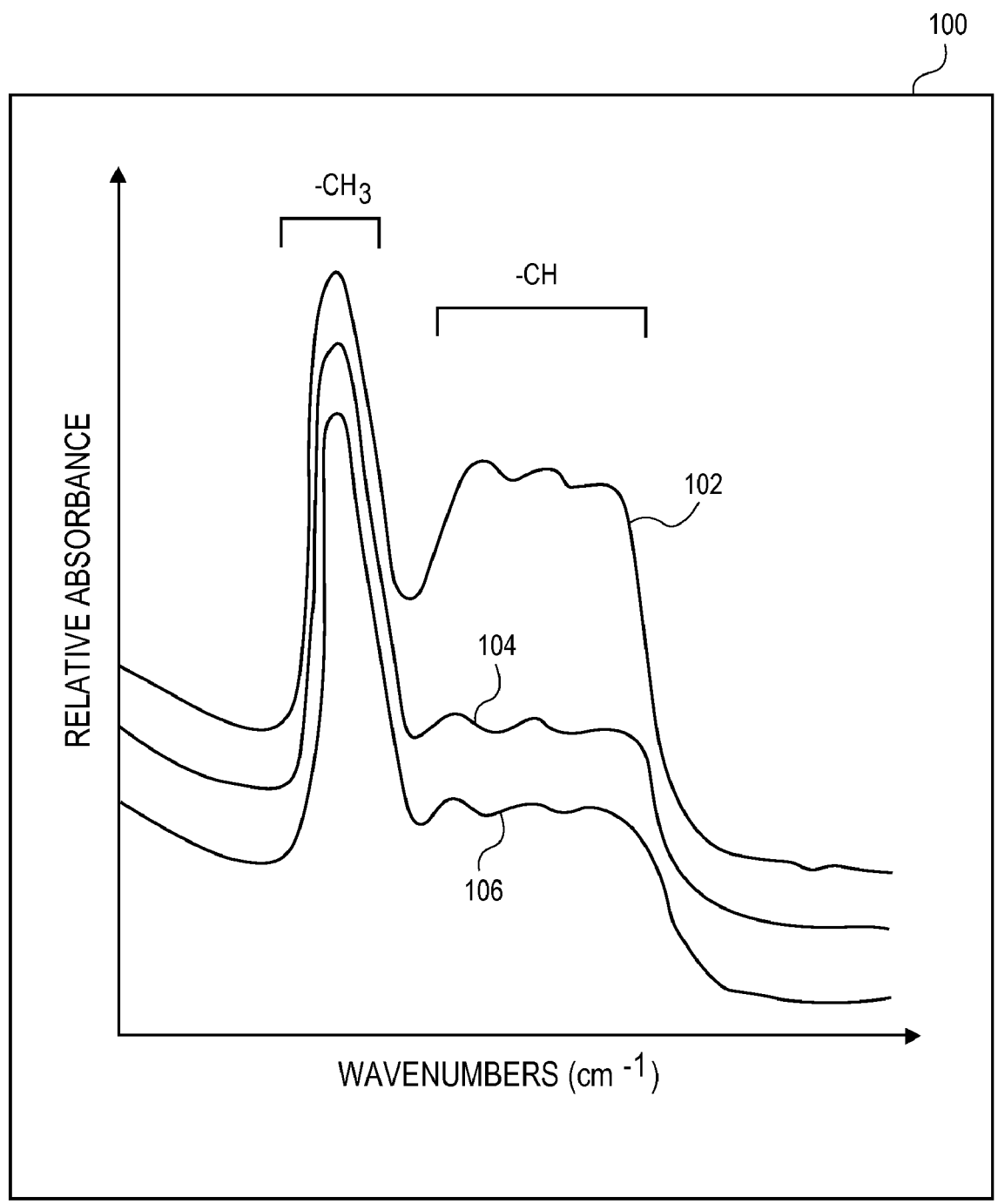
FIG. 1 illustrates a Fourier-Transform Infra-Red Spectrum for a low dielectric constant film at formation, after a chemical-mechanical polishing operation, and after restoration, in accordance with an embodiment of the present invention.

The dielectric constant of a low dielectric constant film may be restored following a chemical-mechanical polishing process operation. FIG. 1 illustrates a Fourier-Transform Infra-Red Spectrum 100 for a low dielectric constant film at formation, after a chemical-mechanical polishing operation, and after restoration, in accordance with an embodiment of the present invention.

Referring to FIG. 1, Fourier-Transform Infra-Red Spectrum 100 includes a plot of relative absorbance as a function of wavenumber ($cm^{-1}$) for a low dielectric constant film. Line 106 represents the spectrum of the low dielectric constant film following formation (e.g. following deposition and cure), line 102 represents the spectrum of the low dielectric constant film following a chemical-mechanical polishing process operation, and line 104 represents the spectrum of the low dielectric constant film following a restoration process. For convenience, lines 102, 104 and 106 are depicted as staggered, as opposed to being super-imposed.

Each line 102, 104 and 106 includes a —CH region, attributable a single C—H bond on a single carbon atom, and a —CH$_3$ region, attributable to three C—H bonds on a single carbon atom. In accordance with an embodiment of the present invention, line 106 indicates that an as-formed porous dielectric film has a low concentration of —CH groups versus —CH$_3$ groups. However, line 102 indicates that upon exposure to an additive having single C—H bonds, the relative concentration of —CH groups of the porous dielectric film increases significantly. In one embodiment, the increased number of —CH groups is attributable to incorporation of the additive into the pores of the porous dielectric film. Line 104 indicates that, upon removal of the additive from the pores of the porous dielectric film, the porous dielectric film can be substantially restored to provide a spectrum similar to that depicted by line 106.

Figure 2:
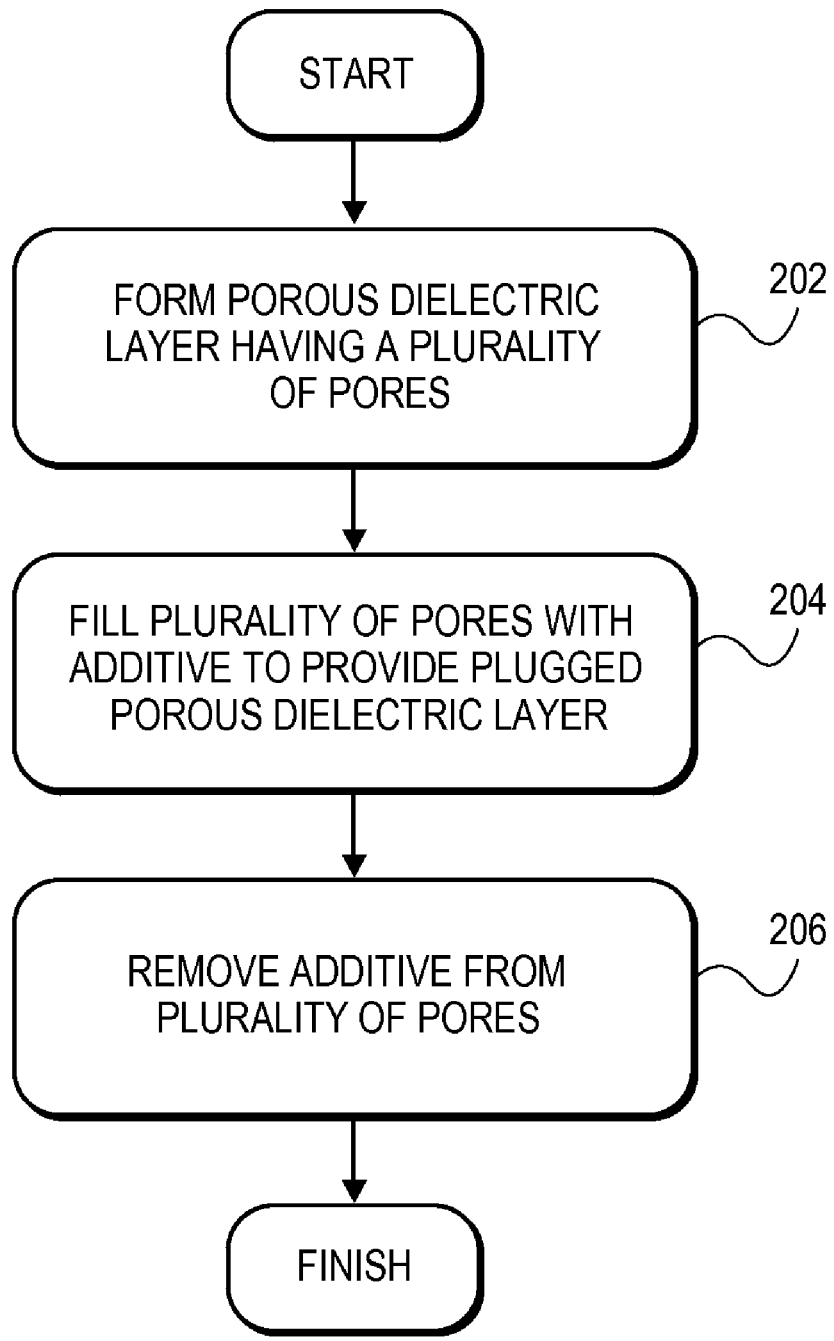
FIG. 2 is a Flowchart representing a series of operations in a method for restoring the dielectric constant of a low dielectric constant film, in accordance with an embodiment of the present invention.

The dielectric constant of a low dielectric constant film may be restored following a chemical-mechanical polishing process operation used in the fabrication of metal interconnects. FIG. 2 is a Flowchart 200 representing a series of operations in a method for restoring the dielectric constant of a low dielectric constant film, in accordance with an embodiment of the present invention. FIGS. 3A-G illustrate cross-sectional views representing a series of operations in a method for restoring the dielectric constant of a low dielectric constant film, in accordance with an embodiment of the present invention.

Figure 3A:
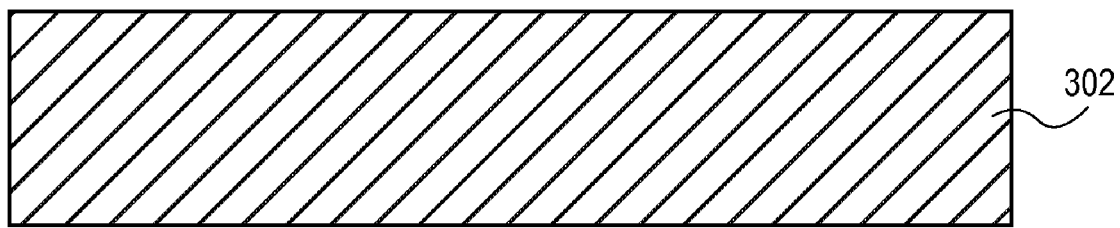
FIGS. 3A-G illustrate cross-sectional views representing a series of operations in a method for restoring the dielectric constant of a low dielectric constant film, in accordance with an embodiment of the present invention.

Referring to FIG. 3A, a substrate 302 is provided. Substrate 302 may be composed of any material suitable to withstand a semiconductor fabrication process. In an embodiment, substrate 302 is composed of a group IV-based material such as, but not limited to, crystalline silicon, germanium or silicon-germanium. In another embodiment, substrate 302 is composed of a III-V material. Substrate 302 may also include an insulating layer. In one embodiment, the insulating layer is composed of a material such as, but not limited to, silicon dioxide, silicon nitride, silicon oxy-nitride or a high-k dielectric layer. Substrate 302 may include an integrated circuit disposed thereon. For example, in accordance with an embodiment of the present invention, substrate 302 includes an insulator layer above plurality of semiconductor devices. In one embodiment, the plurality of semiconductor devices is a plurality of N-type and P-type transistors.

Figure 3B:
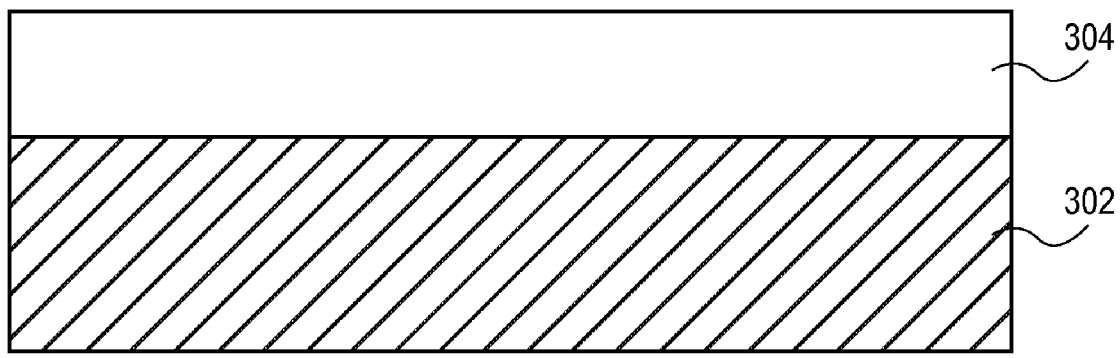
Figure 4:
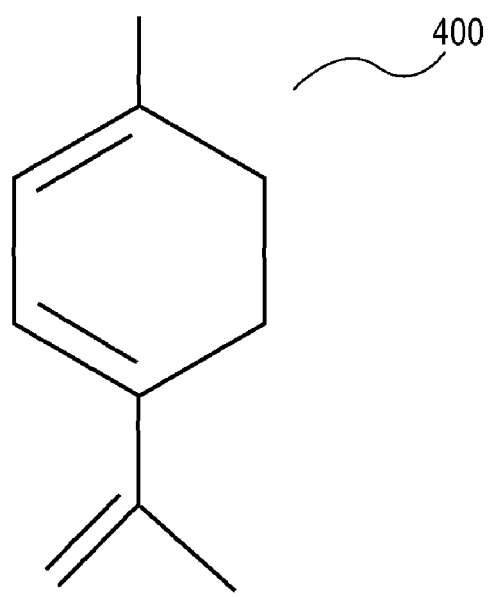
FIG. 4 illustrates a molecular representation of a porogen, in accordance with an embodiment of the present invention.

Referring to FIG. 3B, a dielectric layer 304 is formed above substrate 302. Dielectric layer 304 may be composed of any dielectric material that either already exhibits a low dielectric constant or one that can be converted to a low dielectric constant film. For example, in accordance with an embodiment of the present invention, dielectric layer 304 is composed of a dielectric material having porogens contained therein. In one embodiment, the porogens are removed from dielectric layer 304 at a subsequent process operation to form a porous low dielectric constant dielectric layer. FIG. 4 illustrates a molecular representation of a porogen 400, in accordance with an embodiment of the present invention. In a specific embodiment, dielectric layer 304 is composed of a material such as, but not limited to, carbon-doped silicon dioxide, boron-doped silicon oxide or boron-doped silicon nitride and including molecular porogens, such as molecular porogen 400, contained therein. In a particular embodiment, dielectric layer 304 is composed of carbon-doped silicon dioxide having molecular porogens and is formed by a chemical vapor deposition technique using diethoxy-methyl-silane as a precursor along with molecular porogens such as molecular porogen 400. In an alternative embodiment, dielectric layer is formed as an already porous material. In one embodiment, dielectric layer 304 is formed to a thickness approximately in the range of 150-200 nanometers.

Figure 3C:
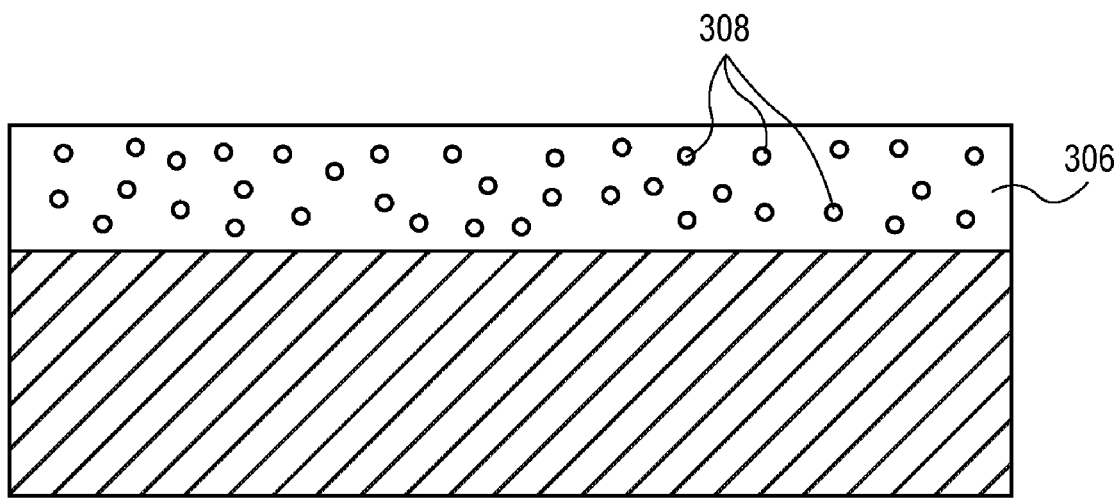

Referring to operation 202 of Flowchart 200 and corresponding FIG. 3C, a plurality of pores 308 is formed in dielectric layer 304 to provide a porous dielectric layer 306. In accordance with an embodiment of the present invention, the plurality of pores 308 are formed by removing a porogen from dielectric layer 304. In one embodiment, dielectric layer 304 is composed of carbon-doped silicon dioxide and the plurality of pores 308 is formed by removing molecular porogens, such as molecular porogen 400, from dielectric layer 304. In a specific embodiment, upon removing the molecular porogens, each pore of the plurality of pores 308 has a diameter approximately in the range of 2-5 nanometers. In an embodiment, the dielectric constant of porous dielectric layer 306 is less than approximately 2.6. In one embodiment, the dielectric constant of porous dielectric layer 306 is approximately 2.4.

Figure 3D:
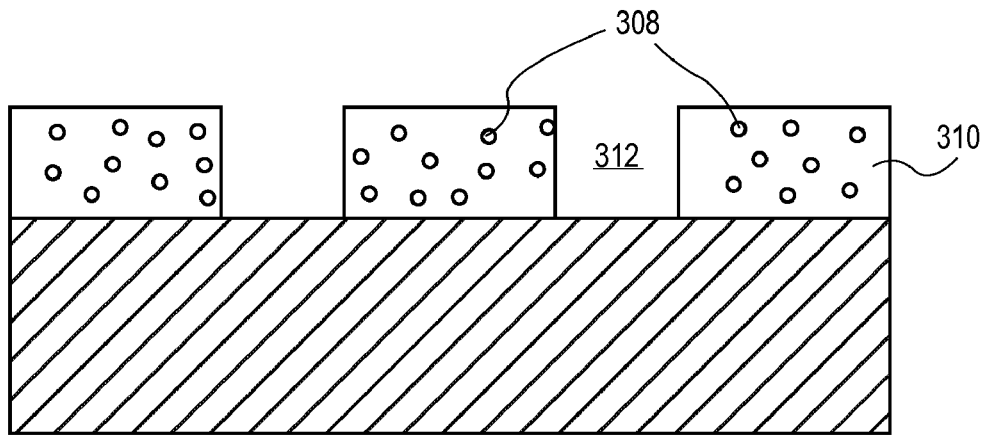

Referring to FIG. 3D, porous dielectric layer 306 is patterned to provide a patterned porous dielectric layer 310 having a trench 312 formed therein. Porous dielectric layer 306 may be patterned to provide patterned porous dielectric layer 310 by any technique suitable to provide a well-defined trench 312 without degrading the film properties of porous dielectric layer 306. In accordance with an embodiment of the present invention, porous dielectric layer 306 is patterned to provide patterned porous dielectric layer 310 by a lithography and etch process. In one embodiment, the lithography operation includes the formation of a patterned photo-resist layer above porous dielectric layer 306 by exposure of a photo-resist layer to a lithographic process such as, but not limited to, 248 nanometer lithography, 193 nanometer lithography, 157 nanometer lithography, extreme ultra-violet (EUV) lithography, immersion lithography or direct-write lithography. In one embodiment, the etch operation includes an anisotropic etch process utilizing gases such as, but not limited to, carbon tetrafluoride ($CF_4$), oxygen ($O_2$), hydrogen bromide (HBr) or chlorine ($Cl_2$). In a particular embodiment, but not depicted, a cap layer may be formed above the top surface of porous dielectric layer 306 to aid with the patterning of dielectric layer 306 to provide patterned porous dielectric layer 310.

Figure 3E:
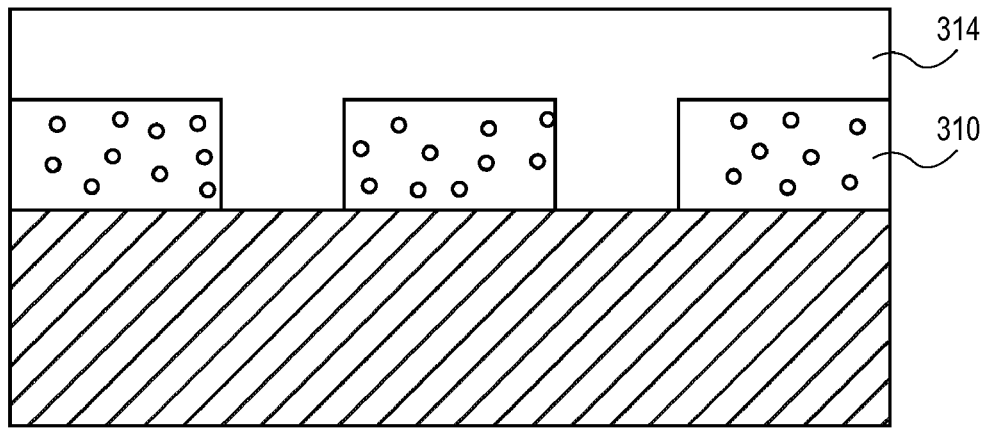

Referring to FIG. 3E, a metal layer 314 is deposited above patterned dielectric layer 310 and in trench 312. Metal layer 314 may be deposited by any technique suitable to substantially and uniformly fill trench 312 in patterned porous dielectric layer 310. In one embodiment, metal layer 314 is composed of a material such as, but not limited to, copper, aluminum or tungsten. In accordance with an embodiment of the present invention, the deposition of metal layer 314 is carried out in two distinct process steps. First, a nucleation portion is formed such as, but not limited to, a copper seed layer. Next, a fill metal portion is formed such as, but not limited to, a bulk copper layer. In one embodiment, the total thickness of metal layer 314 is approximately 600 nanometers, including the portion in trench 312 having a thickness approximately in the range of 150-200 nanometers.

Figure 3F:
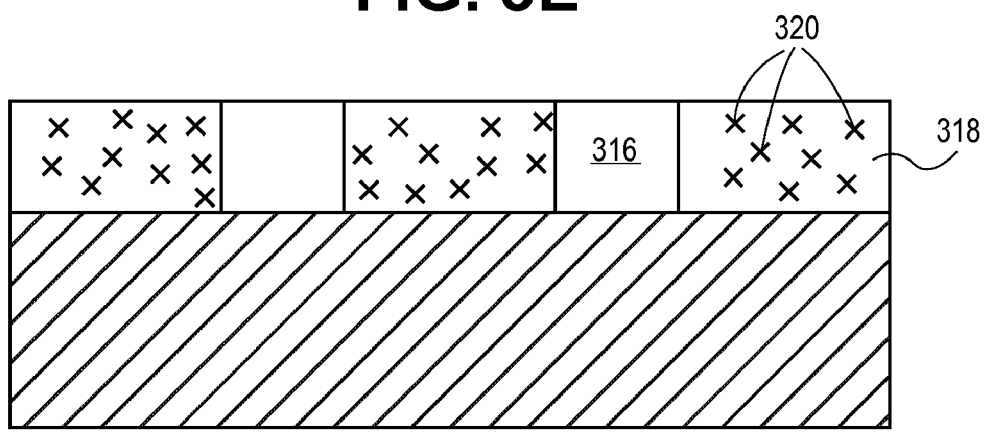

Referring to operation 204 of Flowchart 200 and corresponding FIG. 3F, the plurality of pores 308 is filled with an additive 320 to provide a plugged porous dielectric layer 318. In accordance with an embodiment of the present invention, the plurality of pores 308 is filled with additive 320 during a chemical-mechanical polish operation. In one embodiment, the chemical-mechanical polish operation is applied to the structure of FIG. 3E to remove excess material from metal layer 314 and any cap material that may be disposed above patterned porous dielectric layer 310, exposing the top surface of plugged porous dielectric layer 318, as depicted in FIG. 3F. Thus, in an embodiment, metal structures 316 are formed and are separated by regions of plugged porous dielectric layer 318. In accordance with an embodiment of the present invention, a slurry including additive 320 is used in the chemical-mechanical polish operation and, hence, the plurality of pores 308 is filled with additive 320 to provide plugged porous dielectric layer 318 as a consequence of exposing patterned porous dielectric layer 310 to the slurry. In one embodiment, the slurry is composed of silica, hydrogen peroxide and additive 320. In a specific embodiment, additive 320 contains a C—H group in its molecular structure. Upon filling the plurality of pores 308 with additive 320 to provide plugged porous dielectric layer 318, the dielectric constant of patterned porous dielectric layer 310 may be undesirably increased. For example, in accordance with an embodiment of the present invention, the dielectric constant of porous dielectric layer 306 and, hence, patterned porous dielectric layer 310, is approximately 2.4, while the dielectric constant of plugged porous dielectric layer 318 is greater than approximately 3.

Figure 3G:
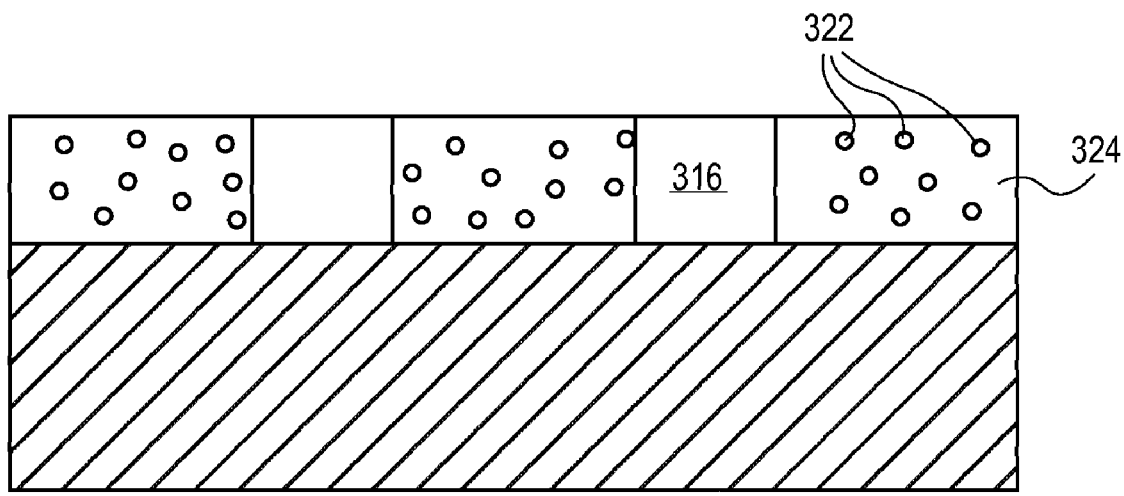

Referring to operation 206 of Flowchart 200 and corresponding FIG. 3G, additive 320 is removed from plugged porous dielectric layer 318 to provide a restored plurality of pores 322. Thus, in accordance with an embodiment of the present invention, a restored porous dielectric layer 324 is formed.

Additive 320 may be removed from plugged porous dielectric layer 318 to provide restored plurality of pores 322 by any technique suitable to substantially restore the dielectric constant of restored porous dielectric layer 324, as compared with the dielectric constant of porous dielectric layer 306 from FIG. 3C. In an embodiment, additive 320 is removed to provide restored plurality of pores 322 by heating plugged porous dielectric layer 318 at a temperature approximately in the range of 250-350 degrees Celsius and for a duration approximately in the range of 10-60 minutes. In one embodiment, the heating is carried out in an atmosphere of argon gas at approximately 1 atmosphere, at a temperature of approximately 300 degrees Celsius and for a duration of approximately 30 minutes. In another embodiment, additive 320 is removed to provide restored plurality of pores 322 by exposing plugged porous dielectric layer 318 to ultra-violet radiation for a duration approximately in the range of 5-20 minutes. In one embodiment, the exposing carried out at a pressure of approximately 1 Torr and at a temperature of approximately 400 degrees Celsius. In another embodiment, additive 320 is removed to provide restored plurality of pores 322 by treating plugged porous dielectric layer 318 with a plasma at a pressure approximately in the range of 1-8 Torr. In one embodiment, the treating is carried out in an atmosphere such as, but not limited to, an ammonia-argon or an ammonia-helium atmosphere.

Upon removal of additive 320 from plugged porous dielectric layer 318, the dielectric constant of restored porous dielectric layer 324 may be lower than that of plugged porous dielectric layer 318. In accordance with an embodiment of the present invention, upon removal of additive 320 from plugged porous dielectric layer 318, the dielectric constant of restored porous dielectric layer 324 is lower than that of plugged porous dielectric layer 318 by at least approximately 0.3. In one embodiment, plugged porous dielectric layer 318 has a dielectric constant greater than approximately 3 and the dielectric constant of restored porous dielectric layer 324 is less than approximately 2.6. The dielectric constant of restored porous dielectric layer 324 may be substantially the same as the dielectric constant of porous dielectric layer 306. In accordance with an embodiment of the present invention, the dielectric constant of restored porous dielectric layer 324 is at most approximately 10% greater than the dielectric constant of porous dielectric layer 306. In one embodiment, the dielectric constant of restored porous dielectric layer 324 is approximately 2.6, while the dielectric constant of porous dielectric layer 306 is approximately 2.4.

Upon restoration of the dielectric constant of restored porous dielectric layer 324, further processing steps may be carried out. For example, in accordance with an embodiment of the present invention, a new dielectric layer is formed above restored porous dielectric layer 324 and a new series of metal structures is formed therein to provide a layered structure of metal interconnects. In one embodiment, the dielectric constant restoration process described above is carried out for each dielectric layer subsequently formed to house additional layers of metal structures.

Figure 5:
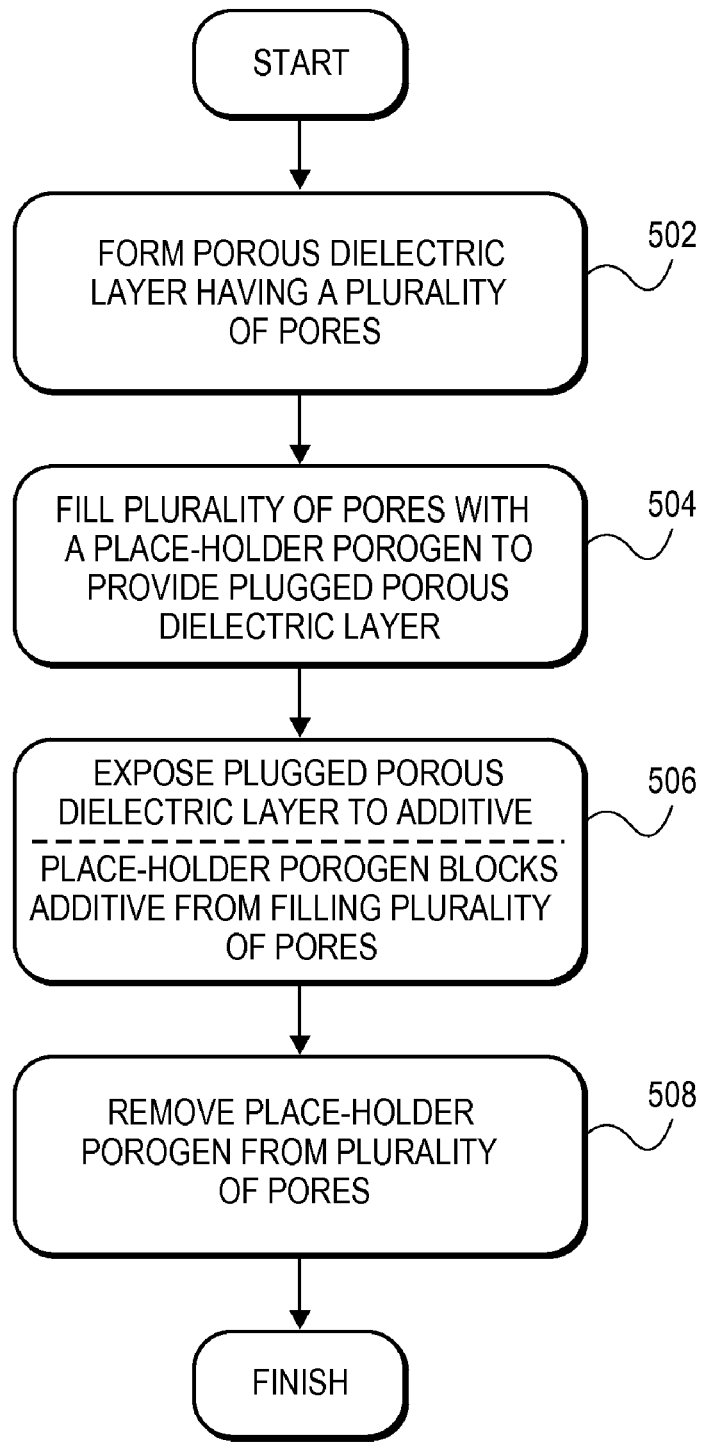
FIG. 5 is a Flowchart representing a series of operations in a method for restoring the dielectric constant of a low dielectric constant film, in accordance with an embodiment of the present invention.

In another aspect of the present invention, it may be preferable to block the filling, with an additive, of a plurality of pores in a dielectric layer. For example, the additive may prove challenging to remove and, thus, a readily-removable place-holder porogen may be used instead of the additive to fill a plurality of pores in a dielectric film. The place-holder porogen may then block undesirable incorporation of the additive during exposure of a porous dielectric layer to the additive, enabling a more effective subsequent restoration process. FIG. 5 is a Flowchart 500 representing a series of operations in a method for restoring the dielectric constant of a low dielectric constant film, in accordance with an alternative embodiment of the present invention.

Referring to operation 502 of Flowchart 500, a porous dielectric layer having a plurality of pores is formed on a substrate. The substrate may be composed of a material and have an arrangement such as those described in association with substrate 302 from FIG. 3A. The porous dielectric layer may be composed of a material and may be formed by a technique described in association with porous dielectric layer 306 from FIG. 3C. The dimensions of each pore of the plurality of pores may be similar to those described in association with plurality of pores 308 from FIG. 3C.

Referring to operation 504 of Flowchart 500, the plurality of pores is filled with a place-holder porogen to provide a plugged porous dielectric layer. In accordance with an embodiment of the present invention, the place-holder porogen is easier to remove, as compared with an additive, when restoring the properties of the porous dielectric film. Thus, place-holder porogen may be composed of any material suitable to temporarily fill the plurality of pores in a porous dielectric layer and to block the filling of the plurality of pores by an additive present in a chemical-mechanical polishing slurry. The place-holder porogen may be incorporated into the plurality of pores by any technique suitable to enable efficient filling. In one embodiment, place-holder porogen is incorporated into the plurality of pores by a technique such as, but not limited to, a wet chemical treatment, a dry gas treatment, or a plasma treatment. In an alternative embodiment, the place-holder porogen is incorporated into the dielectric layer at the time of deposition of the dielectric layer. In that embodiment, a porous film is only first generated after exposure to an additive.

Referring to operation 506 of Flowchart 500, the plugged porous dielectric layer is exposed to a chemical-mechanical polishing slurry having an additive. In accordance with an embodiment of the present invention, the place-holder porogen blocks the additive from filling the plurality of pores of the porous dielectric layer. The additive may be composed of any material described in association with additive 320 from FIG. 3F.

Referring to operation 508 of Flowchart 500, the place-holder porogen is removed from the plurality of pores to restore the film properties, such as the dielectric constant, of the porous dielectric layer. The place-holder porogen may be removed from the plurality of pores by any technique described in association with the removal of additive 320 to form restored plurality of pores 322 in FIG. 3G.

Thus, a method for restoring the dielectric constant of a low dielectric constant film has been disclosed. In accordance with an embodiment of the present invention, a porous dielectric layer having a plurality of pores is formed on a substrate. The plurality of pores is filled with an additive to provide a plugged porous dielectric layer. The additive is then removed from the plurality of pores. In one embodiment, a chemical-mechanical polish technique is used to fill the plurality of pores with the additive.

What is claimed is:

1. A method for restoring the dielectric constant of a low dielectric constant film, comprising:
    forming, on a substrate, a porous dielectric layer having a plurality of pores;
    filling said plurality of pores with an additive to provide a plugged porous dielectric layer, wherein filling said plurality of pores with said additive comprises using a chemical-mechanical polish technique; and
    removing said additive from said plurality of pores.

2. The method of claim 1, wherein removing said additive from said plurality of pores comprises heating said plugged porous dielectric layer at a temperature approximately in the range of 250-350 degrees Celsius for a duration approximately in the range of 10-60 minutes.

3. The method of claim 1, wherein removing said additive from said plurality of pores comprises exposing said plugged porous dielectric layer to ultra-violet radiation for a duration approximately in the range of 5-20 minutes.

4. The method of claim 1, wherein removing said additive from said plurality of pores comprises treating said plugged porous dielectric layer with a plasma at a pressure approximately in the range of 1-8 Torr.

5. A method for restoring the dielectric constant of a low dielectric constant film, comprising:
    forming, on a substrate, a porous dielectric layer having a plurality of pores;
    patterning said porous dielectric layer to provide a trench;
    depositing a metal layer above said porous dielectric layer and in said trench;
    polishing, by using a chemical-mechanical polish technique, said metal layer to expose the top surface of said porous dielectric layer, wherein said plurality of pores are filled with an additive during the polishing to provide a plugged porous dielectric layer; and
    removing said additive from said plurality of pores.

6. The method of claim 5, wherein removing said additive from said plurality of pores comprises heating said plugged porous dielectric layer at a temperature approximately in the range of 250-350 degrees Celsius for a duration approximately in the range of 10-60 minutes.

7. The method of claim 5, wherein removing said additive from said plurality of pores comprises exposing said plugged porous dielectric layer to ultra-violet radiation for a duration approximately in the range of 5-20 minutes.

8. The method of claim 5, wherein removing said additive from said plurality of pores comprises treating said plugged porous dielectric layer with a plasma at a pressure approximately in the range of 1-8 Torr.

9. The method of claim 5, wherein removing said additive from said plurality of pores reduces the dielectric constant of said plugged porous dielectric layer by at least approximately 0.3.

10. The method of claim 9, wherein removing said additive from said plurality of pores reduces the dielectric constant of said plugged porous dielectric layer from greater than approximately 3 to less than approximately 2.6.

11. The method of claim 5, wherein said porous dielectric layer comprises carbon-doped silicon dioxide, and wherein said additive comprises polyethylene glycol.

12. The method of claim 5, wherein each pore of said plurality of pores has a diameter approximately in the range of 2-5 nanometers.

13. A method for restoring the dielectric constant of a low dielectric constant film, comprising:
    forming, on a substrate, a porous dielectric layer having a plurality of pores;
    filling said plurality of pores with a place-holder porogen to provide a plugged porous dielectric layer;
    exposing said plugged porous dielectric layer to an additive, wherein said place-holder porogen blocks said additive from filling said plurality of pores; and
    removing said place-holder porogen from said plurality of pores.

* * * * *